(12) United States Patent
Hwang et al.

(10) Patent No.: US 12,015,408 B2
(45) Date of Patent: Jun. 18, 2024

(54) FLIP FLOP INCLUDING SERIAL STACK STRUCTURE TRANSISTORS

(71) Applicant: Samsung Electronics Co., Ltd., Suwon-si (KR)

(72) Inventors: Hyunchul Hwang, Suwon-si (KR); Minsu Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/712,465

(22) Filed: Apr. 4, 2022

(65) Prior Publication Data

US 2022/0337231 A1    Oct. 20, 2022

(30) Foreign Application Priority Data

Apr. 16, 2021    (KR) .......................... 10-2021-0049580

(51) Int. Cl.
    *H03K 3/012*    (2006.01)
    *H03K 3/013*    (2006.01)
    *H03K 3/356*   (2006.01)

(52) U.S. Cl.
    CPC ....... *H03K 3/356191* (2013.01); *H03K 3/012* (2013.01); *H03K 3/013* (2013.01); *H03K 3/356121* (2013.01)

(58) Field of Classification Search
    CPC .. H03K 3/356191; H03K 3/012; H03K 3/013; H03K 3/356121; H03K 3/037; H03K 3/356104; H03K 3/356017
    See application file for complete search history.

(56) References Cited

U.S. PATENT DOCUMENTS

| | | |
|---|---|---|
| 5,642,061 A | 6/1997 | Gorny |
| 5,841,304 A | 11/1998 | Tam |
| 5,900,759 A | 5/1999 | Tam |
| 6,374,393 B1 | 4/2002 | Hirairi |
| 6,664,836 B1 | 12/2003 | Wen |
| 7,429,880 B2 | 9/2008 | Rana et al. |
| 8,030,969 B2 | 10/2011 | Sumita |
| 8,169,246 B2 | 5/2012 | Malik et al. |
| 8,604,854 B1 * | 12/2013 | Partovi ............ H03K 3/356113 327/202 |
| 8,958,264 B2 * | 2/2015 | Koike ...................... G11C 8/10 365/230.06 |
| 10,367,507 B2 * | 7/2019 | Bunce ................ H03K 19/0963 |

(Continued)

FOREIGN PATENT DOCUMENTS

KR         10-0198962 B1    6/1999

*Primary Examiner* — Sibin Chen
(74) *Attorney, Agent, or Firm* — Harness, Dickey & Pierce, P.L.C.

(57) ABSTRACT

A flip flop includes a precharge circuit configured to charge a first node by bridging a power voltage node and the first node, the charging of the first node by the precharge circuit according to a voltage level of a clock signal, the charging of the first node by the precharge circuit based on at least two PMOS transistors arranged in series, a discharge circuit configured to discharge the first node by bridging the first node and a ground node, the discharging of the first node according to an input signal and the clock signal, and a second node configured to be charged or discharged, the charging and the discharging of the second node according to a voltage level of the first node.

22 Claims, 15 Drawing Sheets

(56) References Cited

U.S. PATENT DOCUMENTS

| | | |
|---|---|---|
| 2005/0083082 A1 | 4/2005 | Olofsson |
| 2007/0069305 A1* | 3/2007 | Kuboyama ...... H03K 19/00338 |
| | | 257/369 |
| 2009/0085629 A1* | 4/2009 | Harris ............. H03K 3/356104 |
| | | 326/40 |
| 2009/0237137 A1 | 9/2009 | Kim |
| 2018/0123569 A1* | 5/2018 | Hwang ........... H03K 3/356121 |

* cited by examiner

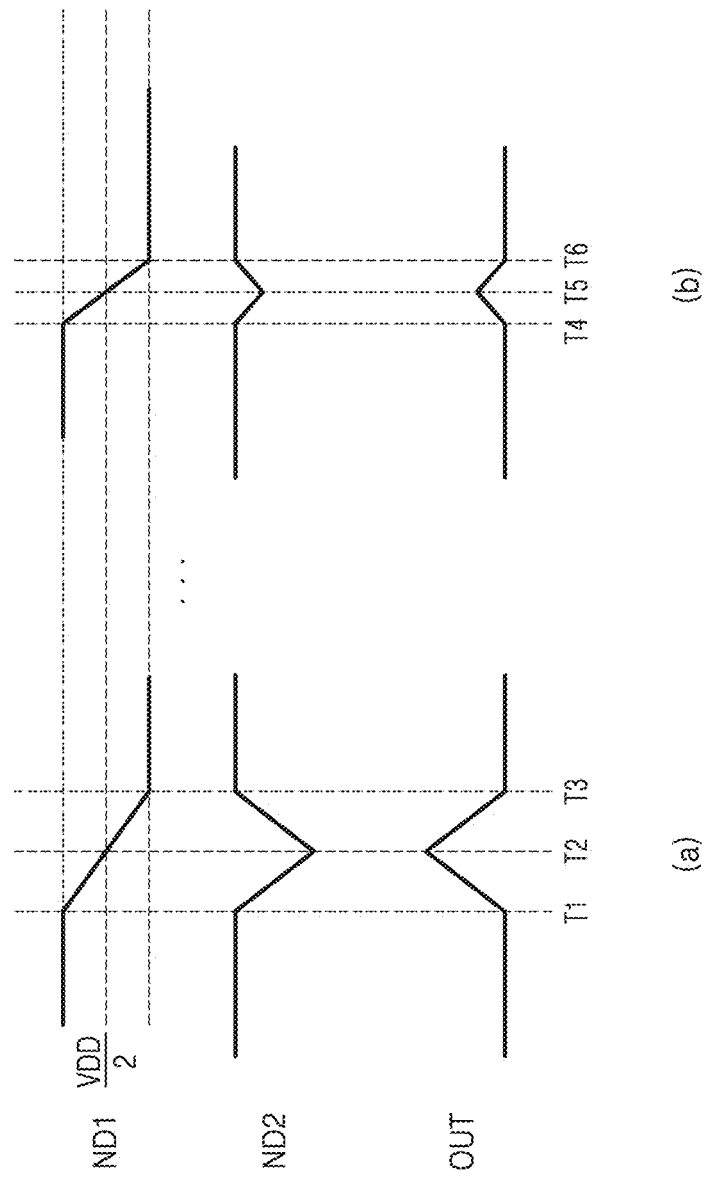

FLIP FLOP INCLUDING SERIAL STACK STRUCTURE TRANSISTORS

CROSS-REFERENCE TO RELATED APPLICATION

This application is based on and claims priority under 35 U.S.C. § 119 to Korean Patent Application No. 10-2021-0049580, filed on Apr. 16, 2021, in the Korean Intellectual Property Office, the disclosure of which is incorporated by reference herein in its entirety.

BACKGROUND

Inventive concepts relate to a flip flop, and more particularly, a flip flop including transistors having a serial stack structure.

An integrated circuit may include a plurality of sequential circuits. A sequential circuit may indicate/refer to a circuit for outputting output data based on input data and on data previously stored. The sequential circuit may be or may include, for example, a latch, a flip flop (FF) and/or an Integrated Clock Gating (ICG) cell. An output from the sequential circuit may be input to a combinational logic circuit for performing a function of the integrated circuit, and an output from the combinational logic circuit may be input to another sequential circuit and/or to the outside.

Because the amount of computations of logic operations performed by the combinational logic circuit increases according to the high integration of integrated circuits, the output from the sequential circuit may be transmitted to the combinational logic circuit, and a delay time taken until the output is transmitted from the combinational logic circuit to a next sequential circuit may increase. To this end, a semi-dynamic flip flop, in which a dynamic circuit is combined with a static circuit, is widely used.

However, glitches are generated depending on the speed at which an input node of the static circuit is discharged and the static circuit is discharged, and all devices are turned on according to the glitch generation such that the amount of power consumed increases.

SUMMARY

Inventive concepts relate to a flip flop, and more particularly, to a flip flop including transistors having a serial stack structure.

A flip flop according to some example embodiments includes a precharge circuit configured to charge a first node by bridging a power voltage node and the first node according to a voltage level of a clock signal, the precharge circuit including at least two PMOS transistors arranged in series, a discharge circuit configured to discharge the first node by bridging the first node and a ground node according to an input signal and the clock signal, and a second node configured to be charged or discharged according to a voltage level of the first node.

According to some example embodiments, there is provided a dynamic flip flop including a dynamic circuit configured to generate a static circuit input signal according to an input signal and to a phase transition of a clock signal, and a static circuit configured to generate an output signal synchronized with the clock signal according to the static circuit input signal from the dynamic circuit. The dynamic circuit comprises a precharge circuit configured to charge a first node by bridging a power voltage node and the first node through which the static circuit input signal is transmitted, and a discharge circuit configured to discharge the first node by bridging the first node and a ground node. The precharge circuit comprises a plurality of PMOS transistors connected in series.

According to some example embodiments, there is provided a flip flop including a clock inverter circuit configured to generate an inverted clock signal by inverting a clock signal, a charge circuit configured to charge a first node by bridging the first node and a power voltage node according to an input signal and the inverted clock signal, a discharge circuit configured to discharge the first node by bridging the first node and a ground node according to the inverted clock signal, the discharge circuit including at least two NMOS transistors arranged in a series structure, a first keeper circuit configured to maintain a voltage level of the first node, a second node charged or discharged according to the voltage level of the first node, and a second keeper circuit configured to maintain a voltage level of the second node.

BRIEF DESCRIPTION OF THE DRAWINGS

Some example embodiments of inventive concepts will be more clearly understood from the following detailed description taken in conjunction with the accompanying drawings in which:

FIG. 6A is a timing diagram illustrating glitch restriction according to some example embodiments;

DETAILED DESCRIPTION OF EXAMPLE EMBODIMENTS

Hereinafter, one or more embodiments of inventive concepts are described with reference to the attached drawings.

Figure 1:
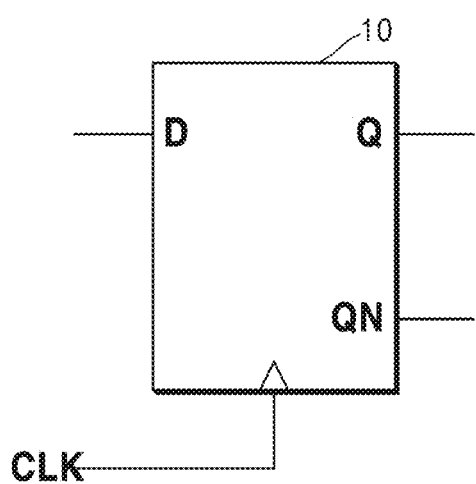
FIG. 1 is a diagram illustrating a logic symbol of a data flip flop, according to some example embodiments.

FIG. 1 is a diagram illustrating a logic symbol of a data flip flop (a D flip flop or DFF, according to an example embodiment.

Referring to FIG. 1, a data flip flop 10 may receive a data input signal D and may output an output signal Q and/or an inverted output signal QN by latching the data input signal D.

The data flip flop 10 of FIG. 1 may be realized as a Transmission-Gate Flip Flop (TGFF). The TGFF may include a transmission gate that receives a clock signal CLK and an inverted clock signal. Because the TGFF uses both the clock signal CLK and the inverted clock signal having an opposite phase to the clock signal CLK, the TGFF may operate according to a two-phase clock. The TGFF is configured to receive the clock signal CLK through two inverters, and when the data input signal D has not transited or toggled, the TGFF may consistently or continuously consume power according to the transition of the clock signal CLK.

Alternatively, the data flip flop 10 may be realized as a True Single Phase Clocking (TSPC) flip flop. The TSPC flip flop may use one clock signal, for example, the clock signal CLK only. For example, the TSPC flip flop may not use the inverted clock signal. However, a dynamic circuit of the TSPC flip flop is repeatedly precharged and discharged. The repetitive pre-charging and discharging of the dynamic circuit are based on clock signal transition and may occur even though the data input signal D has not changed.

Figure 2:
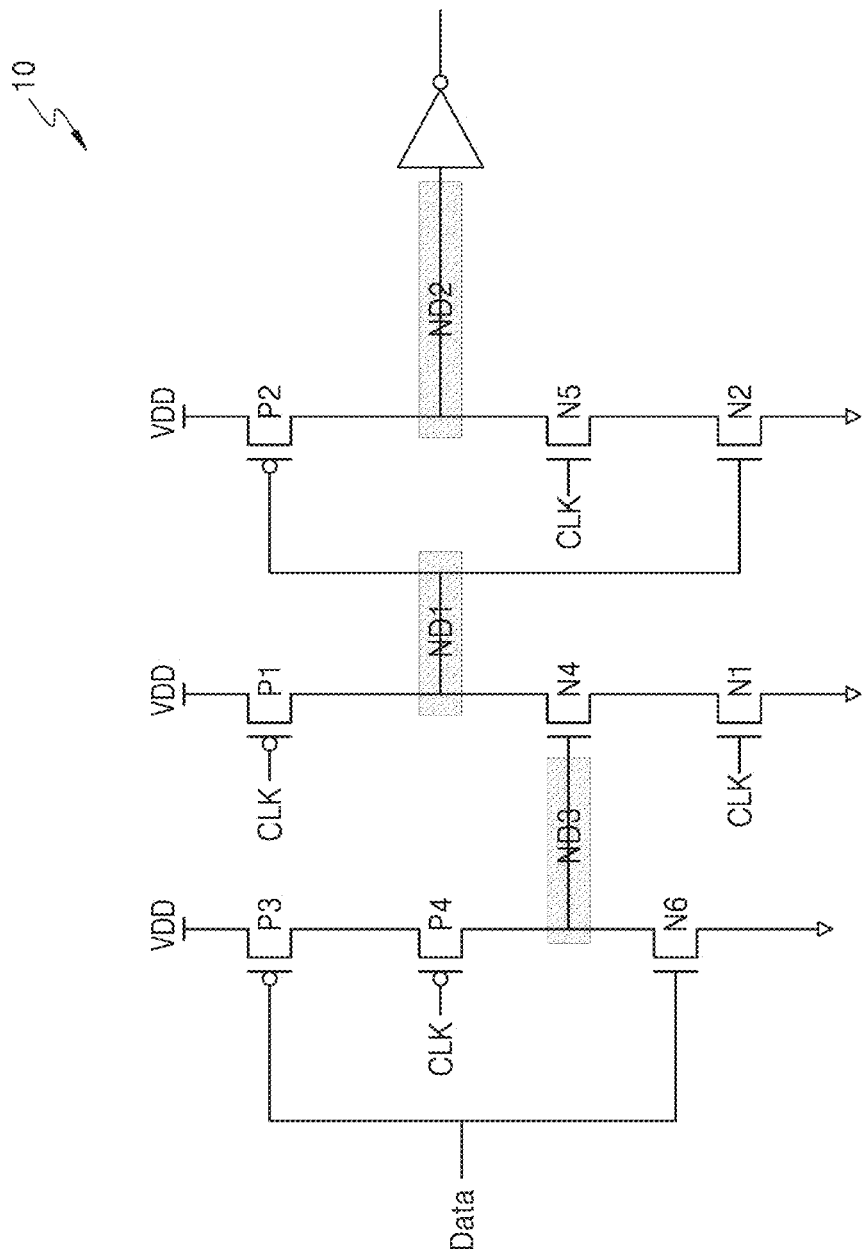
FIG. 2 illustrates a True Single Phase Clocking (TSPC) flip flop having a transistor level.

FIG. 2 illustrates a latch circuit of a TSCP flip flop having a transistor level.

Referring to FIG. 2, while a clock signal CLK is logic low, a precharge operation may be performed. The clock signal CLK may be input to a gate of a first PMOS transistor P1. When the clock signal CLK of "logic low" is input to the gate of the first PMOS transistor P1, the first PMOS transistor P1 may be turned on. When the first PMOS transistor P1 is turned on, a source and a drain of the first PMOS transistor P1 may be electrically connected to each other. Because a first node ND1 connected to the drain of the first PMOS transistor P1 is electrically connected to a power voltage line VDD, the voltage level of the first node ND1 may be precharged to a voltage level of the power voltage line VDD.

The clock signal CLK may be input to a gate of a first NMOS transistor N1. A source of the first NMOS transistor N1 may be connected to a ground line VSS. When the clock signal CLK of "logic low" is input to the gate of the first NMOS transistor N1, the first NMOS transistor N1 may be turned off. Therefore, a voltage level of the first node ND1 charged by the voltage power line VDD may be maintained without dropping.

When the data input signal D is "logic low," a third PMOS transistor P3 may be turned on, and because the clock signal CLK is "logic low," a fourth PMOS transistor P4 may also be turned on. Therefore, a third node ND3 connected to a gate of a fourth NMOS transistor N4 may be precharged to "logic high." Because the data input signal D, which is input to a gate of a sixth NMOS transistor N6, is "logic low," the sixth NMOS transistor N6 may be turned off, and accordingly, a voltage level of the third node ND3, which is precharged to "logic high," may be maintained e.g. at the "logic high" level without or with reduced dropping.

When the clock signal CLK is transited or toggled from "logic low" to "logic high," an evaluation operation may be performed. When the clock signal CLK of "logic high" is input to the gate of the first PMOS transistor P1, the first PMOS transistor P1 may be turned off. For example, the source and the drain of the first PMOS transistor P1 may be electrically open.

Because the data input signal D is maintained at "logic low," the sixth NMOS transistor N6 may still be off, and thus, the third node ND3 may not be electrically connected to the ground line VSS. Therefore, the voltage level of the third node ND3 may remain "logic high." Because the voltage level of the third node ND3 is "logic high," the fourth NMOS transistor N4 may be turned on, and because the clock signal CLK is transited to "logic high," the first NMOS transistor N1 may also be turned on. For example, as the first NMOS transistor N1 and the fourth NMOS transistor N4 are turned on, the first node ND1 may be connected to the ground line VSS, and the first node ND1 may start being discharged.

The first node ND1 may be connected to the gate of each of the second PMOS transistor P2 and the second NMOS transistor N2. When the voltage level of the first node ND1 is transited or toggled from "logic high" to "logic low" according to the discharge of the first node ND1, the second PMOS transistor P2 may be turned on, and the second NMOS transistor N2 may be turned off. For example, a fifth NMOS transistor N5 and the second NMOS transistor N2 corresponding to a discharge path of a second node ND2 are turned off, and the second PMOS transistor P2 corresponding to a path for an electrical connection with the power voltage line VDD is turned on. Thus, the second node N2 may be charged to "logic high."

According to some example embodiments, the second NMOS transistor N2 may be turned on in a certain period of time from a point in time when the clock signal CLK is transited to "logic high." For example, although the clock signal CLK is transited or toggled to "logic high," the voltage level of the first node ND1, which is precharged through the power voltage line VDD, is discharged according to a constant gradient, e.g. at a constant rate of change. For example, while the voltage level of the first node ND1 is discharged to half (½*VDD) of the power voltage line VDD, the second NMOS transistor N2 may keep being on/may keep allowing current to flow from source to drain. Therefore, the second node N2 may be connected to the ground line VSS through the fifth NMOS transistor N5 and the second NMOS transistor N2. Therefore, in a period of time before the voltage level of the first node ND1 is discharged to the half (½*VDD) of the power voltage line VDD, the second node ND2 may also be discharged.

According to some example embodiments, the second NMOS transistor N2 may be turned off/may stop allowing current to flow after the period of time. As described above, when the voltage level of the first node ND1 is discharged to be less than or equal to the half (½*VDD) of the power voltage line VDD, the second NMOS transistor N2 may be turned off. When the second NMOS transistor N2 is turned off, because the path for the electrical connection between the second node ND2 and the ground line VSS is open, the voltage level of the second node ND2 may not drop. When the voltage level of the first node ND1 is discharged to be less than or equal to the half (½*VDD) of the power voltage line VDD, the second PMOS transistor P2 may be turned on/may allow current to flow. When the second PMOS transistor P2 is turned on, the second node ND2 and the power voltage line VDD are electrically connected to each other, and thus, the voltage level of the second node ND2 may increase.

Figure 3:
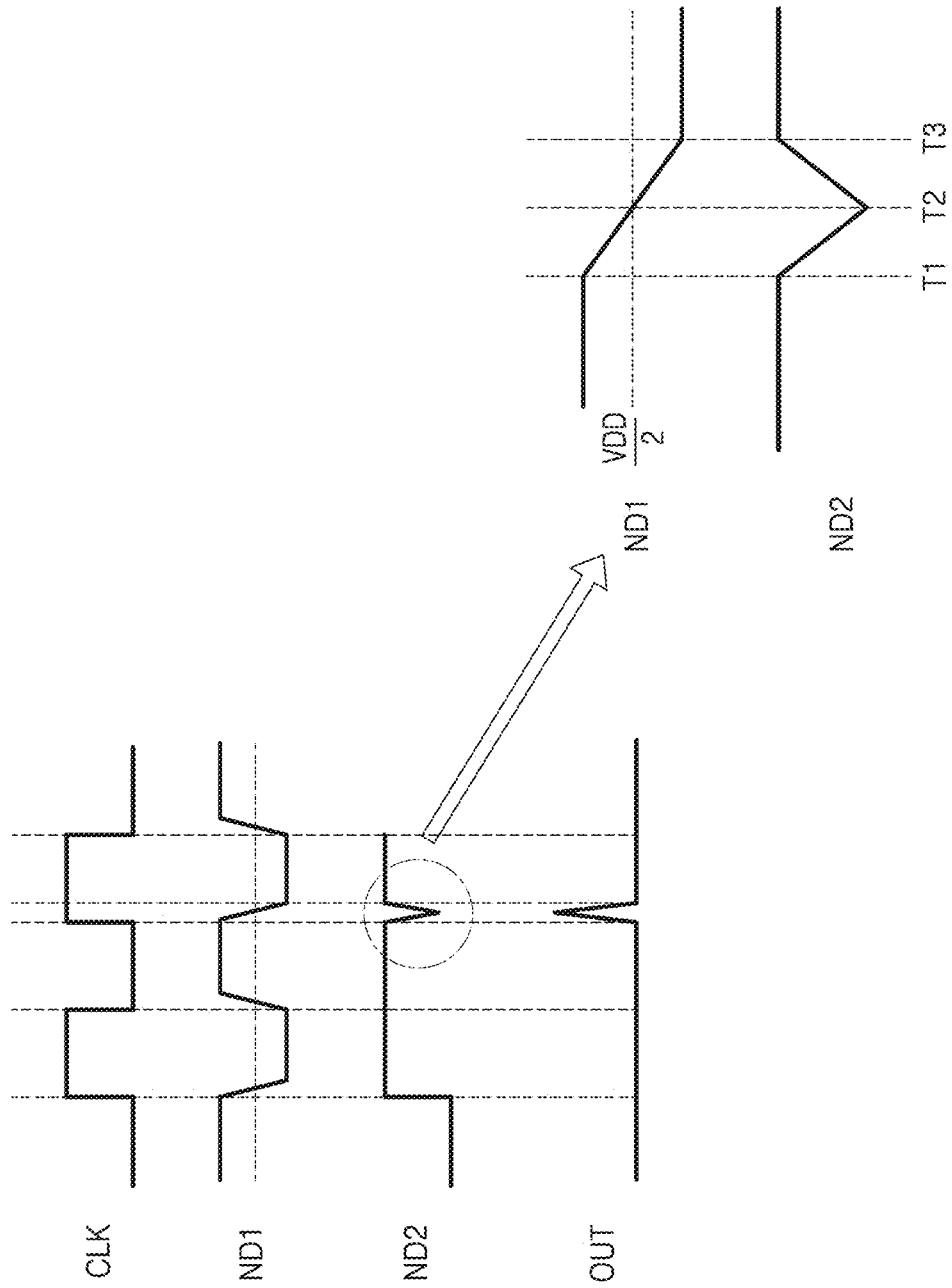
FIG. 3 is a timing diagram illustrating glitch generation of the TSCP flip flop.

FIG. 3 is a timing diagram illustrating a glitch generation of the TSCP flip flop.

Referring to FIG. 3, at a point in time T1, the clock signal CLK may be transited to/may toggle to "logic high" from "logic low." A period of time, in which the clock signal CLK remains "logic low" before the point in time T1, may correspond to a precharge period of time. For example, the first node ND1 may be connected to the power voltage line VDD by the first PMOS transistor P1, which is turned on, and the voltage level of the first node ND1 may be precharged to the power voltage line VDD. The first node ND1 may not be grounded by the first NMOS transistor N1 that is turned on, and the precharged voltage level of the first node ND1 may be maintained to the power voltage line VDD. At the point in time T1, the first node ND1 may start being discharged from the point in time when the clock signal CLK is transited.

In a period of time from T1 to T2, the voltage level of the first node ND1 may remain greater than the half (½*VDD) of the power voltage line VDD. For example, although the voltage of the first node ND1 starts dropping from the point in time T1, the voltage level of the first node ND1 may not be discharged to "logic low" without a delay time. Therefore, in the period of time from T1 to T2, the second PMOS transistor P2 may keep or maintain being off according to a discharge delay of the first node ND1, and the second NMOS transistor N2 may keep or remain being on. Because the clock signal CLK also remains "logic high" in the period of time from T1 to T2, the second node ND2 may be electrically connected to the ground line VSS through the discharge path including the fifth NMOS transistor N5 and the second NMOS transistor N2. Therefore, in the period of time from T1 to T2, the voltage of the second node ND2 may drop.

In a period of time from T2 to T3, the voltage level of the first node ND1 may be maintained to a voltage level lower than the half (½*VDD) of the power voltage line VDD. According to various example embodiments, a gradient of the voltage drop in the period of time from T1 to T2 may be identical to that of the voltage drop in the period of time from T2 to T3. When the voltage level of the first node ND1 becomes lower than/less than half (½*VDD) of the power voltage line VDD, the second PMOS transistor P2 may be turned on, and the second NMOS transistor N2 may be turned off. For example, because the second NMOS transistor N2 is turned off in the discharge path generated in the period of time from T1 to T2, the second node ND2 may not be electrically connected to the ground line VSS. Additionally or alternatively, at the same time, the second PMOS transistor P2 is turned on, and thus, the second node ND2 may be electrically connected to the power voltage line VDD. Therefore, the voltage level of the second node ND2 having dropped in the period of time from T1 to T2 may be recharged and thus increased. Referring to FIG. 2 together, because an output signal OUT is a signal generated by inverting the second node ND2 through a CMOS inverter 140, a peak signal having a uniform size in a period of time from T1 to T3, that is, a glitch, may be generated.

To restrict the glitch generation, a length of the period of time from T1 to T3 may have to be reduced. For example, when a length of a period of time reaching the half of the power voltage line VDD is reduced by quickly discharging the first node ND1 in the period of time from T1 to T2, and/or when the length of a period of time is reduced until the second node ND2 is quickly discharged and charged to the power voltage line in the period of time from T2 to T3, the glitch generation may be restricted or reduced in likelihood of occurrence and/or reduced in impact from occurring. The restriction of the glitch generation by reducing the length of the period of time from T1 to T3 is described below.

Figure 4:
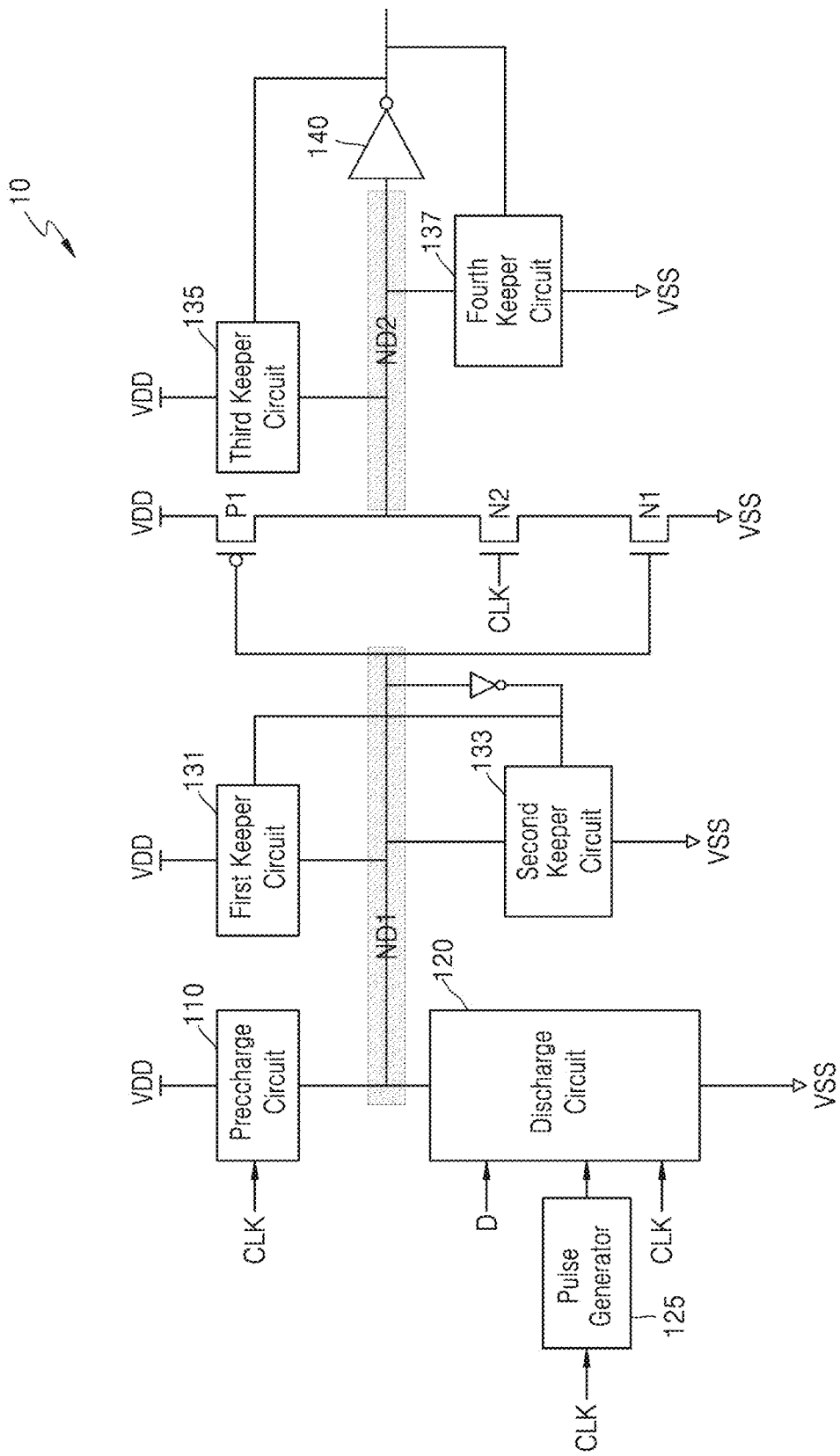
FIG. 4 illustrates a flip flop according to some example embodiments.

FIG. 4 illustrates a latch circuit of a flip flop according to some example embodiments.

Referring to FIG. 4, the data flip flop 10 may include a precharge circuit 110, a discharge circuit 120, first keeper circuit 131 to fourth keeper circuit 137, and a CMOS inverter 140. The CMOS inverter 140 may generate an output signal OUT by inverting a signal from the second node ND2.

The precharge circuit 110 may be connected between the power voltage line VDD and the discharge circuit 120. According to various example embodiments, the precharge circuit 110 may include a plurality of PMOS transistors. The precharge circuit 110 may include at least two such as more than two PMOS transistors, and the at least two PMOS transistors may be connected in series and configured to form or be arranged in a stack structure (or in a NAND array). For example, the precharge circuit 110 may have a two-stack structure in which two PMOS transistors are connected in series.

According to various example embodiments, each of the PMOS transistors included in the precharge circuit 110 may receive the same clock signal CLK, e.g. concurrently and/or simultaneously. For example, when the precharge circuit 110 has the two-stack structure in which two PMOS transistors are connected in series, the clock signal CLK may be input to a gate of one PMOS transistor, and the same clock signal CLK may be input to a gate of the other PMOS transistor. The plurality of PMOS transistors included in the precharge circuit 110 may each have the same and/or similar electrical characteristics, such as the same and/or similar gate widths; however, example embodiments are not limited thereto.

According to various example embodiments, the number of PMOS transistors included in the precharge circuit 110, e.g. arranged in series in the precharge circuit 110, may be in proportion to the speed of discharging the first node ND1. For example, as the number of PMOS transistors is increased, a time taken to drop the voltage of the first node ND1 to the half (½*VDD) of the power voltage line VDD may decrease. Referring to FIG. 3 together, the greater the number of PMOS transistors is, the shorter the length of the period of time from T1 to T2 may be. Because of the serial stack structure, the PMOS transistors may be turned off faster, e.g. much faster to release the electrical connection between the first node ND1 and the power voltage line VDD.

The discharge circuit 120 may receive the clock signal CLK and the data input signal D, and may selectively discharge the first node ND1 according to the clock signal CLK and the data input signal D. For example, the discharge circuit 120 may turn on or turn off the electrical connection between the ground line VSS and the first node ND1 that is precharged, while the clock signal CLK holds a "logic-low" state. An operation in which the discharge circuit 120 selectively discharges the first node ND1 may correspond to the above-described evaluation operation. The discharge circuit 120 may be configured to include logic gates according to a logical operation determined in advance and/or determined dynamically or variably. According to various example embodiments, the discharge circuit 120 may be referred to as a logic circuit. In some example embodiments, the discharge circuit 120 receives one data input signal D, but the number of input signals received by the discharge circuit 120 is not limited thereto. Additionally or alternatively, a logical operation performed by the discharge circuit 120 internally may be an AND operation, a NAND operation, an OR operation, a NOR operation, an XOR operation, or one or more combinations thereof. However, example embodiments are not limited thereto.

A pulse generator 125 may receive the clock signal CLK as an input and generate a pulse signal for an evaluation operation of the discharge circuit 120. According to various example embodiments, the pulse generator 125 may operate based on combinations of at least one inverter, a delay circuit, and logic gates.

The keeper circuits 131 to 137 may include transistors such as either or both of NMOS transistors and PMOS transistors for maintaining a voltage level of a connected node. The first keeper circuit 131 may connect the first node ND1 to the power voltage line VDD. The second keeper circuit 133 may connect the first node ND1 to the ground line VSS. The third keeper circuit 135 may connect the power voltage line VDD to the second node ND2. The fourth keeper circuit 137 may connect the second node ND2 to the ground line VSS.

According to some example embodiments, the first keeper circuit 131 and the second keeper circuit 133 may be configured to maintain the voltage level of the first node ND1 by receiving a feedback signal from the first node ND1 as an input. The third keeper circuit 135 and the fourth keeper circuit 137 may be configured to maintain the voltage level of the connected node by receiving the output signal OUT as an input. Detailed examples of the keeper circuits 131 to 137 are described below.

Figure 5:
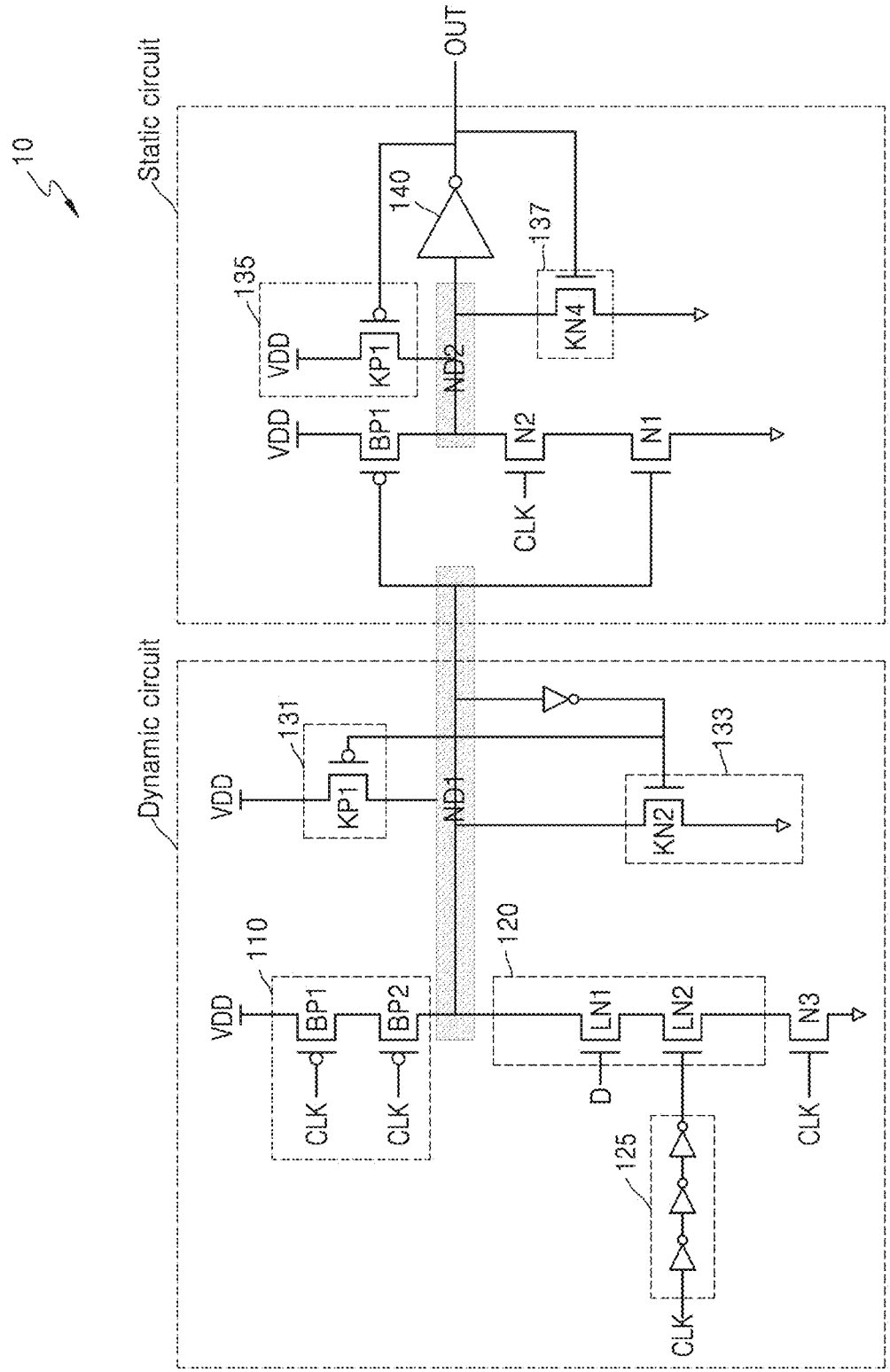
FIG. 5 is a transistor-level circuit diagram of a flip flop according to some example embodiments.

FIG. 5 is a transistor-level circuit diagram of a flip flop according to some example embodiments.

Referring to FIG. 5, the precharge circuit 110 may include a first blocking PMOS transistor BP1 and a second blocking PMOS transistor BP2. In some example embodiments below, the precharge circuit 110 includes two PMOS transistors, but example embodiments are not limited thereto. As described above with reference to FIG. 4, the precharge circuit 110 may include two or more PMOS transistors, and may not include only one transistor.

According to various example embodiments, a dynamic circuit in a front end (e.g. near the input to the flip flop 10) may include the precharge circuit 110, the discharge circuit 120, the first keeper circuit 131, and the second keeper circuit 133, and a static circuit in a rear end (e.g. near the output of the flip flop 10) may include the CMOS inverter 140, the third keeper circuit 135, and the fourth keeper circuit 137.

According to various example embodiments, a source of the first blocking PMOS transistor BP1 may be connected to the power voltage line VDD. A drain of the first blocking PMOS transistor BP1 may be connected to a source of the second blocking PMOS transistor BP2. The first blocking PMOS transistor BP1 and the second blocking PMOS transistor BP2 may be serially connected to each other and may form a serial stack structure. The first blocking transistor BP1 and the second blocking transistor BP2 may have the same and/or similar electrical properties and/or geometrical properties, such as the same and/or similar gate widths; however, example embodiments are not limited thereto. The first blocking PMOS transistor BP1 and the second blocking PMOS transistor BP2 may be simultaneously and/or concurrently turned on/off according to the same clock signal CLK. As at least two PMOS transistors, or more PMOS transistors are serially connected and simultaneously or concurrently turned off, the connection between the first node ND1 and the power voltage line VDD, for example, the precharge circuit 110, may be quickly/more quickly turned off.

According to various example embodiments, a pulse generator 125 may include a number, such as an odd number, such as three inverters connected in series. The pulse generator 125 may receive the clock signal CLK as an input and generate a pulse signal for an evaluation operation of the discharge circuit 120. The pulse generator 125 of FIG. 5 includes three inverters serially connected, but example embodiments are not limited thereto.

According to various example embodiments, the discharge circuit 120 may include a first logic NMOS transistor LN1 and a second logic NMOS transistor LN2. Referring to FIG. 4 together, when a logic level of the data input signal D is "logic high," the discharge circuit 120 may generate an electrical path of or between the first node ND1 and the ground line VSS. For example, because the pulse signal, which is input through the second logic NMOS transistor LN2 during the evaluation operation, holds a "logic-high" state, when the clock signal CLK holds a "logic-high" state, the third NMOS transistor N3 may be turned on, and the discharge circuit 120 may be connected to the ground line VSS through the third NMOS transistor N3 and discharge the first node ND1.

The first keeper circuit 131 may charge the first node ND1 so as to have the logic level of the first node ND1 remain "logic high." The first keeper circuit 131 may include one or more PMOS transistors. Referring to FIG. 5, the first keeper circuit 131 may include a first keeper PMOS transistor KP1. The first keeper PMOS transistor KP1 may receive an inverted signal of the first node ND1 through a gate terminal of the first keeper PMOS transistor KP1. For example, when the first node ND1 holds the "logic-high" state, the inverted signal of "logic low" may be input to the gate terminal of the first keeper PMOS transistor KP1, and thus, the first keeper PMOS transistor KP1 may be turned on. The first node ND1 may be electrically connected to the power voltage line VDD, and the logic level of the first node ND1 may be charged to remain "logic high."

The second keeper circuit 133 may discharge the first node ND1 so as to have the logic level of the first node ND1 remain "logic low." The second keeper circuit 133 may at least one NMOS transistor. Referring to FIG. 5, the second keeper circuit 133 may include a second keeper NMOS transistor KN2. The second keeper NMOS transistor KN2 may receive the inverted signal of the first node ND1 through the gate terminal of the second keeper NMOS transistor KN2. For example, when the logic level of the first node ND1 is "logic low," the inverted signal of "logic high" may be input to the gate terminal of the second keeper NMOS transistor KN2, and thus, the second keeper NMOS transistor KN2 may be turned on. The first node ND1 may be electrically connected to a ground line such as the ground line VSS, and the logic level of the first node ND1 may be discharged to remain "logic low."

According to various example embodiments, the third keeper circuit 135 and the fourth keeper circuit 137 may maintain the voltage level of the second node ND2 according to the output signal OUT. The third keeper circuit 135 may include a third keeper PMOS transistor KP3 that includes a gate terminal receiving the output signal OUT. For example, when the voltage level of the second node ND2 is "logic high," an inverted signal of "logic low" may be transmitted to a gate of the third keeper PMOS transistor KP3, and thus, the voltage level of the second node ND2 may remain "logic high." Although the voltage level of the second node ND2 drops by a certain value, a signal output from the CMOS inverter 140 and transmitted to the gate of the third keeper PMOS transistor KP3 holds a "logic-low" state, and the voltage level of the second node ND2 may be stably or more stably maintained accordingly. The fourth keeper circuit 137 may include a fourth NMOS transistor KN4. A principle in which the voltage level of the second node ND2 is maintained is the same as that of the third keeper circuit 135, and thus, a description thereof is omitted.

In some example embodiments, each of the first keeper circuit 131 to the fourth keeper circuit 137 includes one transistor, but one or more embodiments are not limited thereto. According to various example embodiments, the first keeper circuit 131 and/or the third keeper circuit 135 may include a plurality of PMOS transistors and may or may not include one or more NMOS transistors. Alternatively or additionally, the second keeper circuit 133 and/or the fourth keeper circuit 137 may include a plurality of NMOS transistors and may or may not include one or more PMOS transistors. The PMOS transistors may be serially connected to each other, and the NMOS transistors may be connected to each other in parallel.

FIG. 6A is a timing diagram illustrating glitch restriction/glitch reduction, according to some example embodiments.

Referring to FIG. 6A, in (a) points in time T1-T3 may correspond to points in time T1-T3 illustrated in FIG. 3 for comparison. In (b) a point in time T4, the clock signal CLK may be transited from/toggled from "logic low" to "logic high." A period of time in which the clock signal CLK remains "logic low" before the point in time T4 may correspond to a precharge period of time. For example, the first node ND1 may be connected to the power voltage line VDD by the first PMOS transistor P1 that is turned on, and the voltage level of the first node ND1 may be precharged to a voltage level of the power voltage line VDD.

In a period of time from T4 to T5, the voltage level of the first node ND1 may still be greater than half of the power voltage line VDD. Referring to the period of time from T4 to T5 and the period of time from T1 to T2 together, the second speed at which the first node ND1 is discharged in the period of time from T4 to T5 may be greater than the first speed at which the first node ND1 is discharged in the period of time T1 to T2. A difference between the first speed and the second speed may be based on the first blocking PMOS transistor BP1 and the second blocking PMOS transistor BP2 that are simultaneously/concurrently turned off according to the same clock signal CLK. For example, when two or more PMOS transistors having a serial stack structure are simultaneously or concurrently turned off, the speed at which an open circuit is formed/created between the first node ND1 and the power voltage line VDD may be increased as opposed to when a single blocking PMOS transistor is turned off. Because the speed at which the first node ND1 and the power voltage line VDD are completely open increases, a time to interrupt the discharge of the first node ND1 through the discharge circuit 120 decreases, and the second speed that is the discharge speed in the period of time from T4 to T5 may be faster than the first speed that is the discharge speed in the period of time from T1 to T2. In the period of time from T4 to T5, the voltage level of the first node ND1 reaches the half (½*VDD) of the power voltage line VDD much faster, a length of the period of time from T4 to T5 may be less than that of the period of time from T1 to T2. Alternatively or additionally, a voltage drop degree of the second node ND2 may be reduced as the length of the period of time from T4 to T5 decreases. That is, a size of a peak voltage of a glitch may decrease.

In a period of time from T5 to T6, the voltage level of the first node ND1 may remain less than the half (½*VDD) of the power voltage line VDD. When the voltage level of the first node ND1 becomes less than the half (½*VDD) of the power voltage line VDD, the second PMOS transistor P2 may be turned on, and the second NMOS transistor N2 may be turned off. For example, because the second NMOS transistor N2 is turned off in the discharge path generated in the period of time from T4 to T5, the second node ND2 may not form an electrical connection with the ground line VSS. Alternately or additionally, at the same time and/or concurrently, the second PMOS transistor P2 is simultaneously turned on, and thus, the second node ND2 may be electrically connected to the power voltage line VDD. Therefore, the voltage level of the second node ND2 having dropped in the period of time from T4 to T5 may be recharged and thus increased. According to various example embodiments, a length of a period of time from T5 to T6 may be less than that of the period of time from T2 to T3 (e.g. with reference to a flip flop having a precharge circuit 10 illustrated in FIG. 2). Because the size of the second node ND2, of which the voltage has dropped in the period of time from T4 to T5, decreases, a length of the period of time, which is taken to recharge the voltage of the second node ND2 to the voltage level of the power voltage level VDD, that is, the period of time from T5 to T6, m, that is, the period of time from T5 to T6, may also decrease.

Figure 6B:
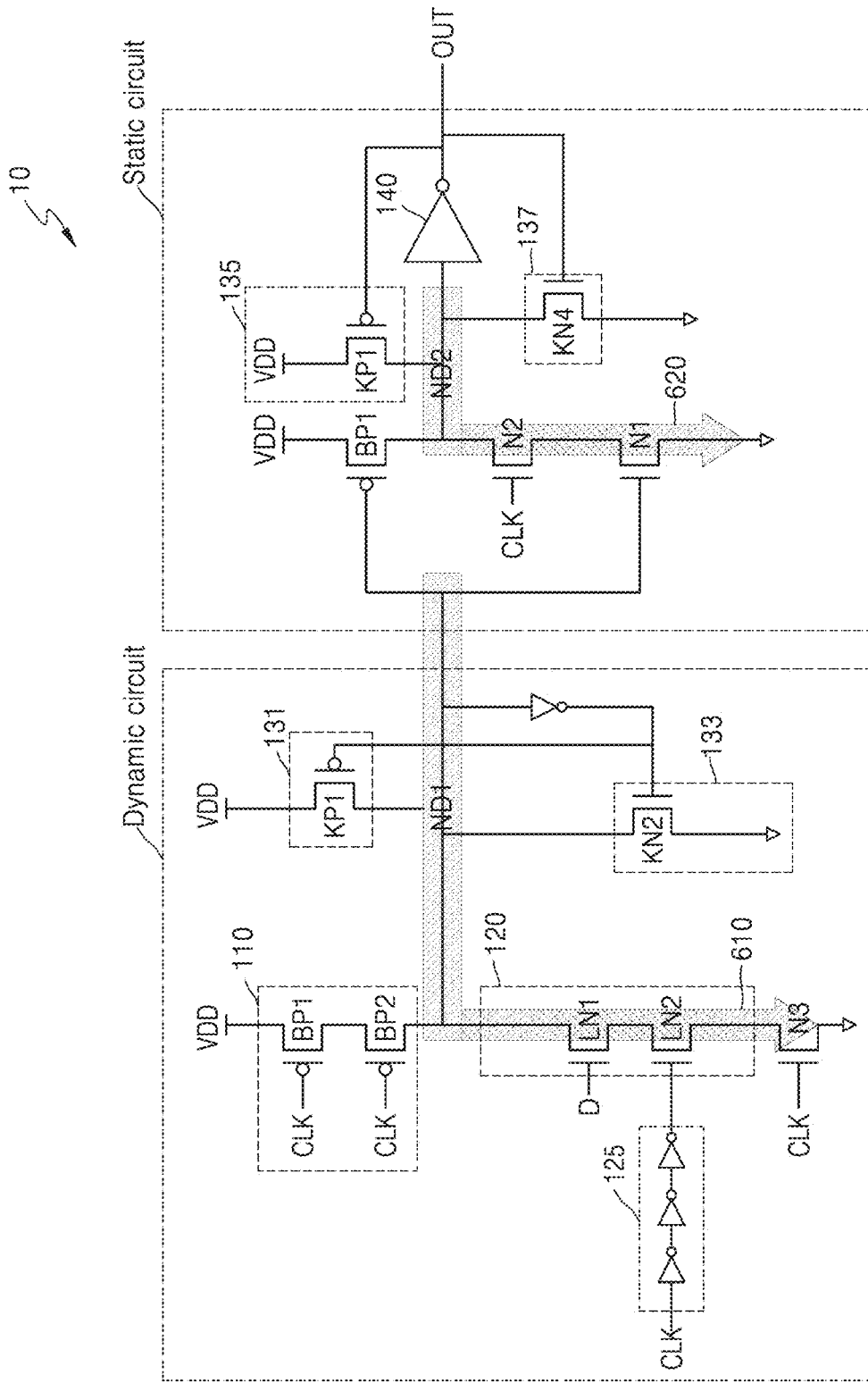
FIG. 6B illustrates a discharge path of a second node, according to some example embodiments.

FIG. 6B illustrates a discharge path of a second node, according to some example embodiments.

Referring to FIG. 6B, discharge paths of the first node ND1 and the second node ND2 are respectively illustrated. Referring to FIGS. 6A and 6B together, a first discharge path 610 and a second discharge path 620 of FIG. 6B may indicate paths activated in the period of time from T1 to T2 and the period of time from T4 to T5, respectively.

According to various example embodiments, the discharge circuit 120 (or a logic circuit) of FIG. 6B may determine a logic level of the data input signal D. When the data input signal D is in a "logic-high" state, the discharge circuit 120 may perform a voltage drop of the first node ND1 by activating discharge path. The discharge circuit 120 may include a first logic NMOS transistor LN1 receiving the data input signal D through a gate terminal thereof, and a second logic NMOS transistor LN2 receiving a pulse signal generated by the pulse generator 125 through a gate terminal of the second logic NMOS transistor LN2. The first logic NMOS transistor LN1 and the second logic NMOS transistor LN2 may be serially connected to each other, and may include the same, or similar, electrical and/or geometrical properties such as gate widths.

In the first discharge path 610, the voltage level of the first node ND1 may drop according to the data input signal D. When the clock signal CLK is transited from "logic low" to "logic high" in the point in time T1, the precharge circuit 110 may form an open circuit and an equivalent circuit. When the clock signal CLK is in the "logic-high" state, the first blocking PMOS transistor BP1 and the second blocking PMOS transistor BP2 included in the precharge circuit 110 may be turned off, respectively. The first node ND1 and the power voltage line VDD may be electrically open.

The first logic NMOS transistor LN1 may receive the data input signal D of "logic high," the second logic NMOS transistor LN2 may receive the pulse signal of "logic high," and the third NMOS transistor N3 may receive the clock signal (CLK) of "logic high." Thus, the first logic NMOS transistor LN1, the second logic NMOS transistor LN2, and the third NMOS transistor N3 may be respectively turned on. Accordingly, the first discharge path 610 of the first node ND1 may correspond to an electrical path including the first logic NMOS transistor LN1, the second logic NMOS transistor LN2, and the third NMOS transistor N3. When the data input signal D does not satisfy or is not in a "logic-high" level, the discharge circuit 120 may not form the first discharge path 610.

The second keeper NMOS transistor KN2 of the second keeper circuit 133 may receive an inverted signal of the first node ND1. When the logic level of the first node ND1 is "logic low," because the second keeper NMOS transistor KN2 included in the second keeper circuit 133 is turned off, an electrical connection with the ground line VSS may not be formed. Therefore, although the first node ND1 is unexpectedly charged, the second keeper circuit 133 may discharge the first node ND1 through the ground line VSS and maintain the logic level of the first node ND1 to "logic low."

The first keeper circuit 131 may include the first keeper PMOS transistor KP1 electrically connected to the power voltage line VDD. The first keeper PMOS transistor KP1 may receive an inverted signal from the first node ND1 as an input. When the first node ND1 is in the "logic-low" state, the first keeper PMOS transistor KP1 may be turned on. Therefore, through the electrical connection/bridging between the first node ND1 and the power voltage line VDD, the first keeper circuit 131 may be driven to maintain the voltage level of the first node ND1 to "logic high" despite unexpected discharge of the first node ND1.

The voltage level of the first node ND1 in the period of time from T1 to T2 or T4 to T5 may drop to the half (½*VDD) of the power voltage line VDD. Because the clock signal CLK is in the "logic-high" state, the second NMOS transistor N2 may be on. The logic level of the first node ND1 may be received through the gate terminal of the first NMOS transistor N1. When the voltage level of the first node ND1 is greater than the half (½*VDD) of the power voltage line VDD, the first NMOS transistor N1 may operate in an on state. That is, the second node ND2 may include the second discharge path 620 including the second NMOS transistor N2 and the first NMOS transistor N1. The second discharge path 620 may be formed during a delay time (e.g., the period of time from T1 to T2 and the period of time from T4 to T5) required to switch the voltage level of the first node ND1 from "logic high" to "logic low."

Figure 7:
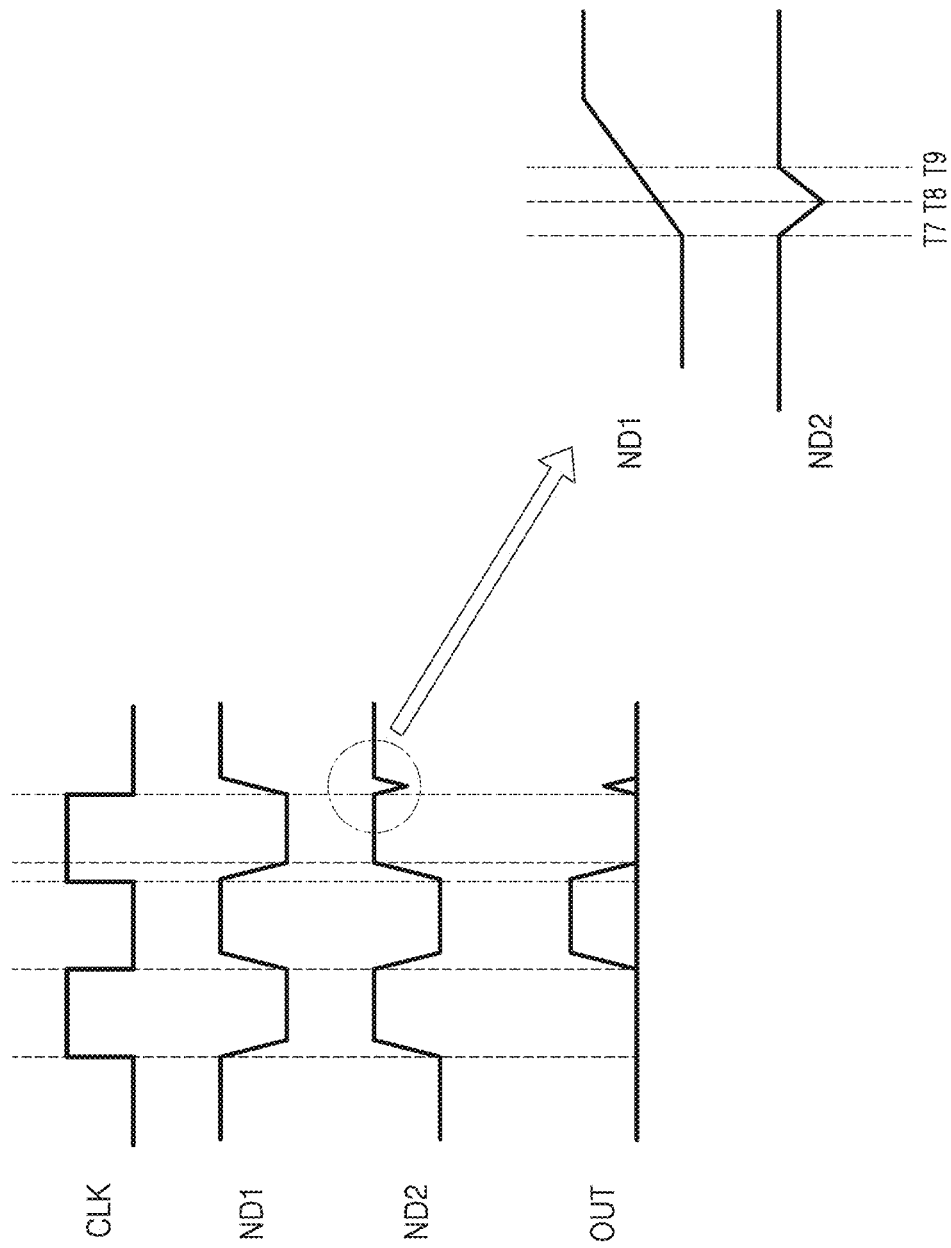
FIG. 7 is a timing diagram illustrating glitch restriction according to some example embodiments.

FIG. 7 is a timing diagram illustrating glitch restriction according to some example embodiments.

Referring to FIG. 7, the clock signal CLK may be transited from "logic high" to "logic low" in a point in time T7. Referring to FIG. 5 together, although the clock signal CLK is transited in the point in time T7, there may be a certain delay time to completely turn off the second NMOS transistor N2. When the clock signal CLK is transited to/toggles to "logic low," the first blocking PMOS transistor BP1 and the second blocking PMOS transistor BP2 of the precharge circuit 110 may be respectively turned on. According to some example embodiments, when the PMOS transistors are connected in series to form a serial stack structure, a delay time to turn on the precharge circuit 110 may increase. That is, as the power voltage line VDD is electrically connected to the first node ND1, a time taken to precharge the first node ND1 may increase. In a period of time from T7 to T8, for example, the precharge circuit 110 may include a single PMOS transistor. In this case, the precharge circuit 110 may be quickly turned on, and the speed of precharging the first node ND1 may increase accordingly. When a time to turn on the first NMOS transistor N1 is reduced as the first node ND1 is quickly precharged, the first NMOS transistor N1 may be turned on faster than the second NMOS transistor N2 is turned off. Because the first NMOS transistor N1 and the second NMOS transistor N2 are simultaneously turned on, the second node ND2 may be temporarily connected to the ground line VSS and discharged. That is, the voltage of the second node ND2 may temporarily drop in the period of time from T7 to T8.

It may be assumed that the second NMOS transistor N2 is completely turned off in the point in time T8. When the second NMOS transistor N2 is completely turned off, the electrical connection/bridging between the second node ND2 and the ground line VSS may be released regardless of how much the voltage level of the first node ND1 is charged. In a period of time from T8 to T9, the second node ND2 may not be discharged. As the first node ND1 is precharged, the first PMOS transistor P1 may be turned on, and because the second node ND2 is electrically connected to the power voltage line VDD, the second node ND2 may be charged to "logic high."

For example, the precharge circuit 11 may reduce the speed of precharging the first node ND1 by increasing the number of PMOS transistors in series forming the serial stack structure and may restrict the glitch generation in a falling edge, at which the clock signal CLK is transited to "logic low," by preventing or reducing the likelihood of and/or impact from the second NMOS transistor N2 and the first NMOS transistor N1 being simultaneously or concurrently turned on.

Figure 8A:
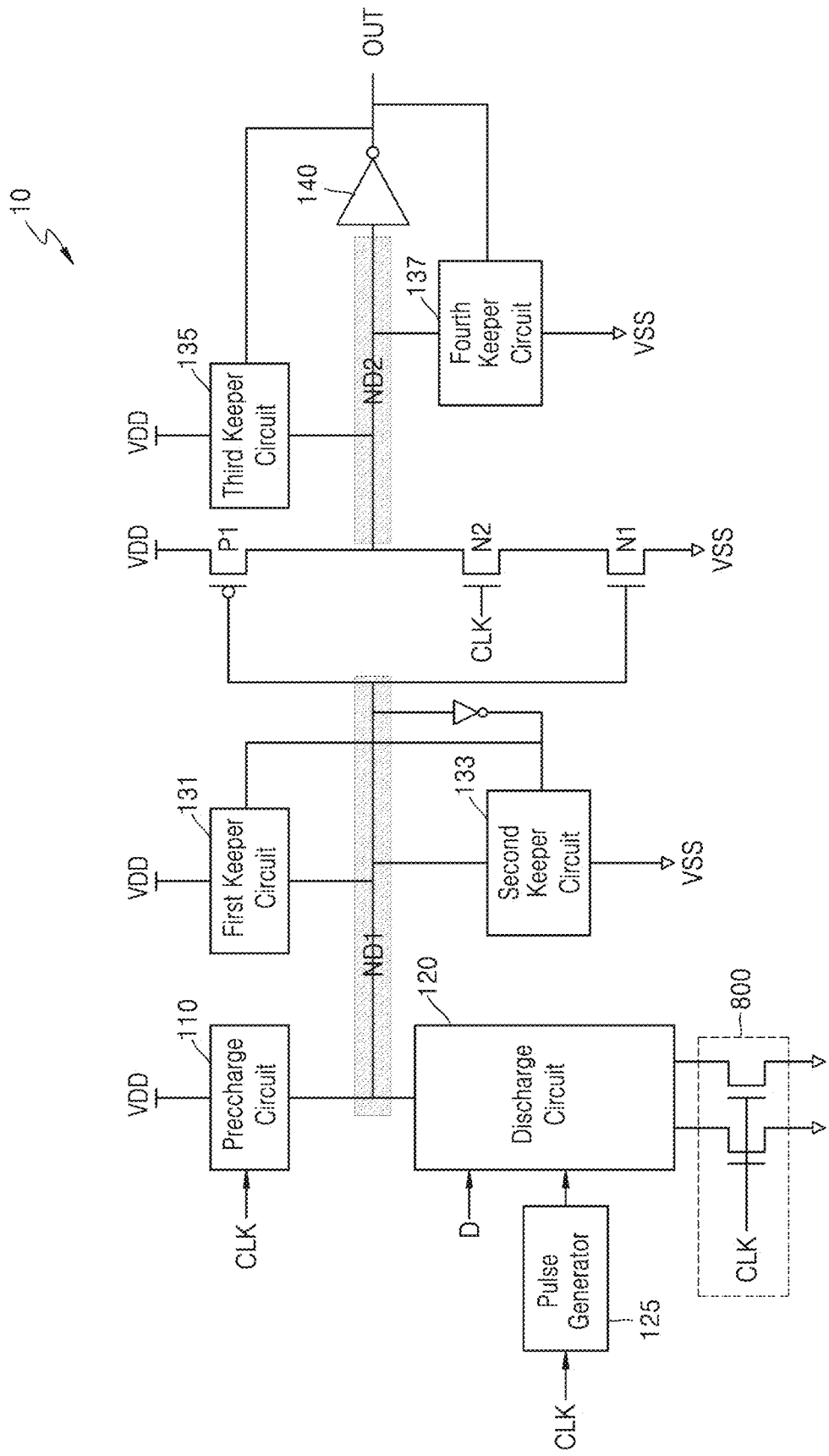
FIG. 8A illustrates a flip flop according to some example embodiments.
Figure 8B:
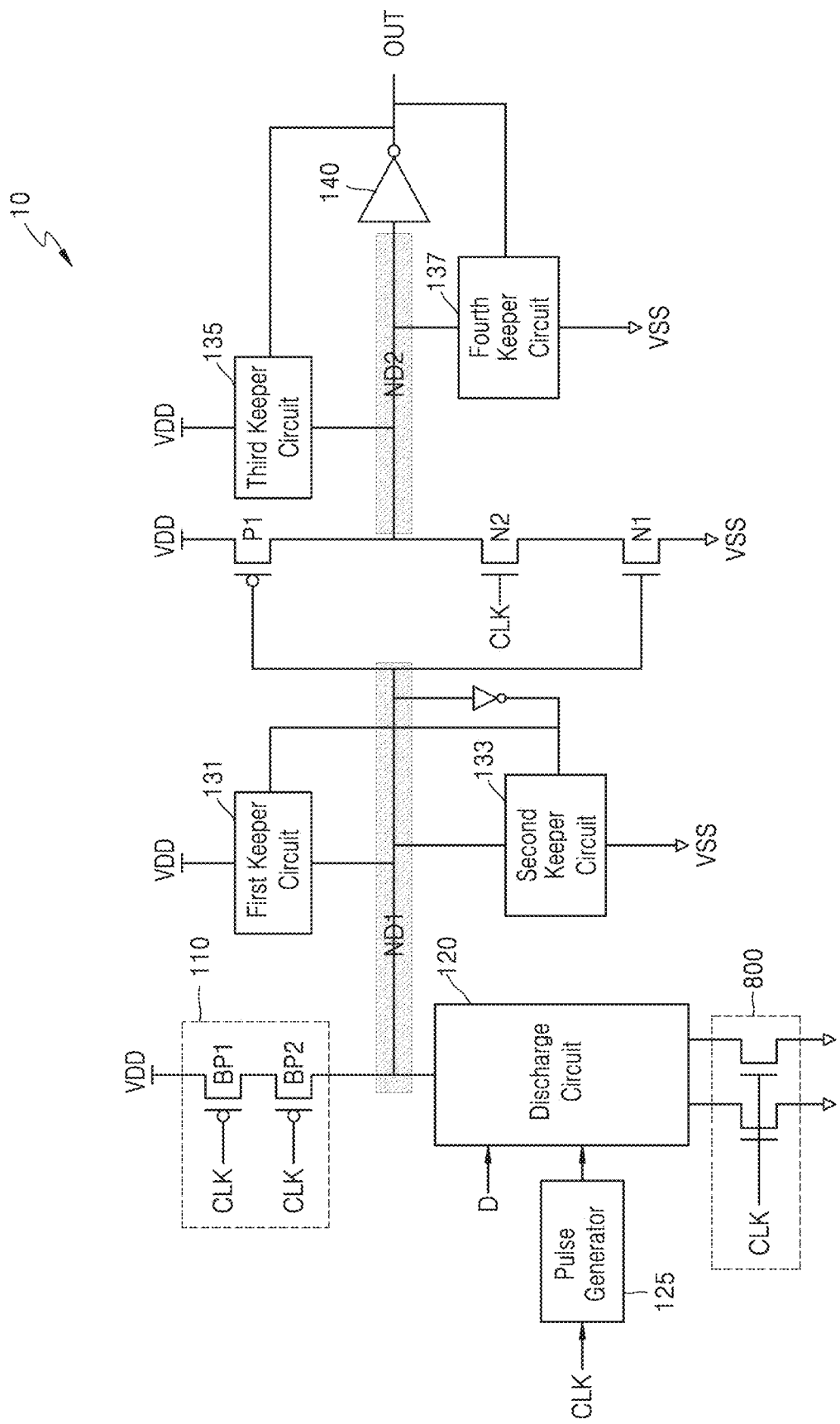
FIG. 8B illustrates a flip flop according to some example embodiments.
Figure 8C:
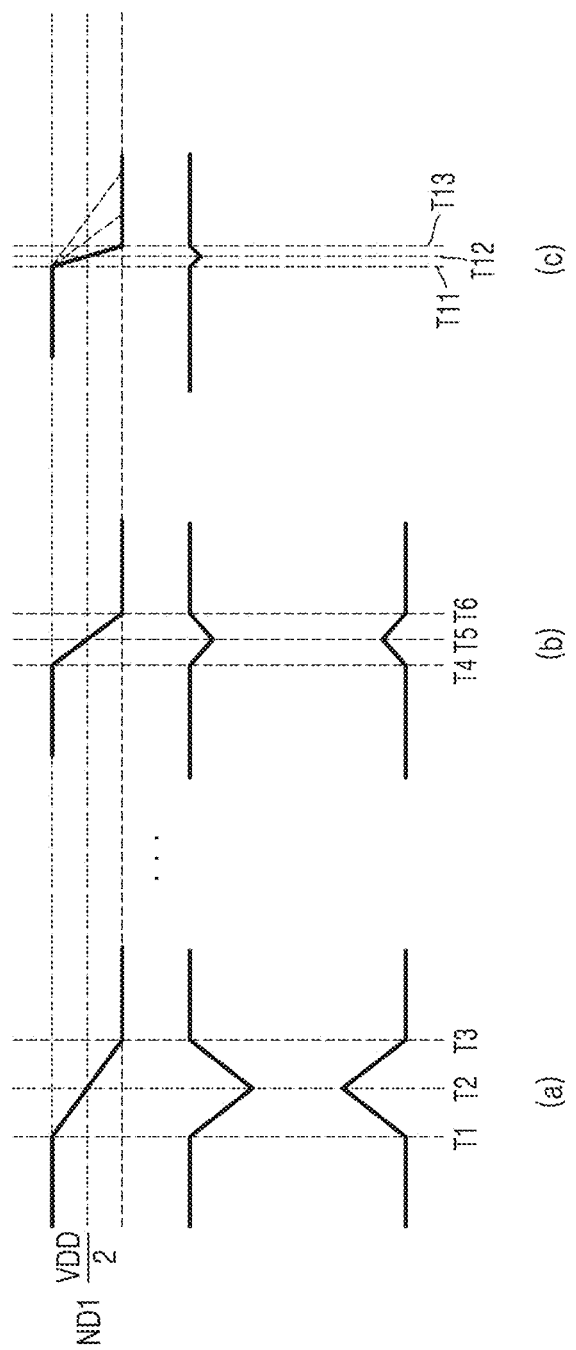
FIG. 8C is a timing diagram illustrating glitch restriction according to some example embodiments.

FIGS. 8A and 8B illustrate latch circuits of flip flops according to some example embodiments, and FIG. 8C is a timing diagram illustrating glitch restriction according to some example embodiments.

Referring to FIGS. 8A, 8B, and 4, the data flip flop 10 may further include an additional discharge circuit 800.

According to various example embodiments, the additional discharge circuit 800 may include at least two such as more than two NMOS transistors. Each of the at least two NMOS transistors may be turned on or off according to the same clock signal CLK. The additional discharge circuit 800 may be connected between the ground line VSS and the discharge circuit 120.

Referring to FIG. 8A, the additional discharge circuit 800 may include two NMOS transistors connected in parallel. When the clock signal CLK is transited to "logic high," each of two NMOS transistors may generate an electrical path between the discharge circuit 120 and the ground line VSS. The additional discharge circuit 800 may increase the speed, at which the voltage level of the first node ND1 drops, by generating at least two such as more than two more electrical paths/bridges between the discharge circuit 120 and the ground line VSS.

FIG. 8C is a timing diagram illustrating glitch restriction in the data flip flop 10 of FIG. 8A. In (a), timings T1 to T3 are illustrated; in (b), timings T4 to T6 are illustrated, and in (c), timings T11 to T13 are illustrated. In a period of time from T11 to T12 in (c), the voltage level of the first node ND1 may remain greater than the half of the power voltage line VDD. Referring to the periods of time from T1 to T2 and T4 to T5 together in (a) and (b), the third speed, at which the first node ND1 is discharged, may be greater than the first speed and the second speed in the period of time from T11 to T12. This may be because the third speed is based on the fact that the first node ND1 is discharged much faster by the additional discharge circuit 800. Because the speed at which the first node ND1 is discharged is fast, a point in time when the first NMOS transistor N1 connected to the first node N1 is turned off may be advanced. Before the first NMOS transistor N1 is turned off after the clock signal CLK is transited to "logic high," the second node ND2 is discharged through the ground line VSS, and glitches are generated accordingly. Thus, as the point in time when the first NMOS transistor N1 is turned off is advanced, a time taken to discharge the second node ND2 and a voltage drop degree of the second node ND2 may also decrease. For example as the data flip flop 10 may further include the additional discharge circuit 800, the voltage drop degree of the second node ND2 may decrease, and the glitches may be restricted.

Figure 9:
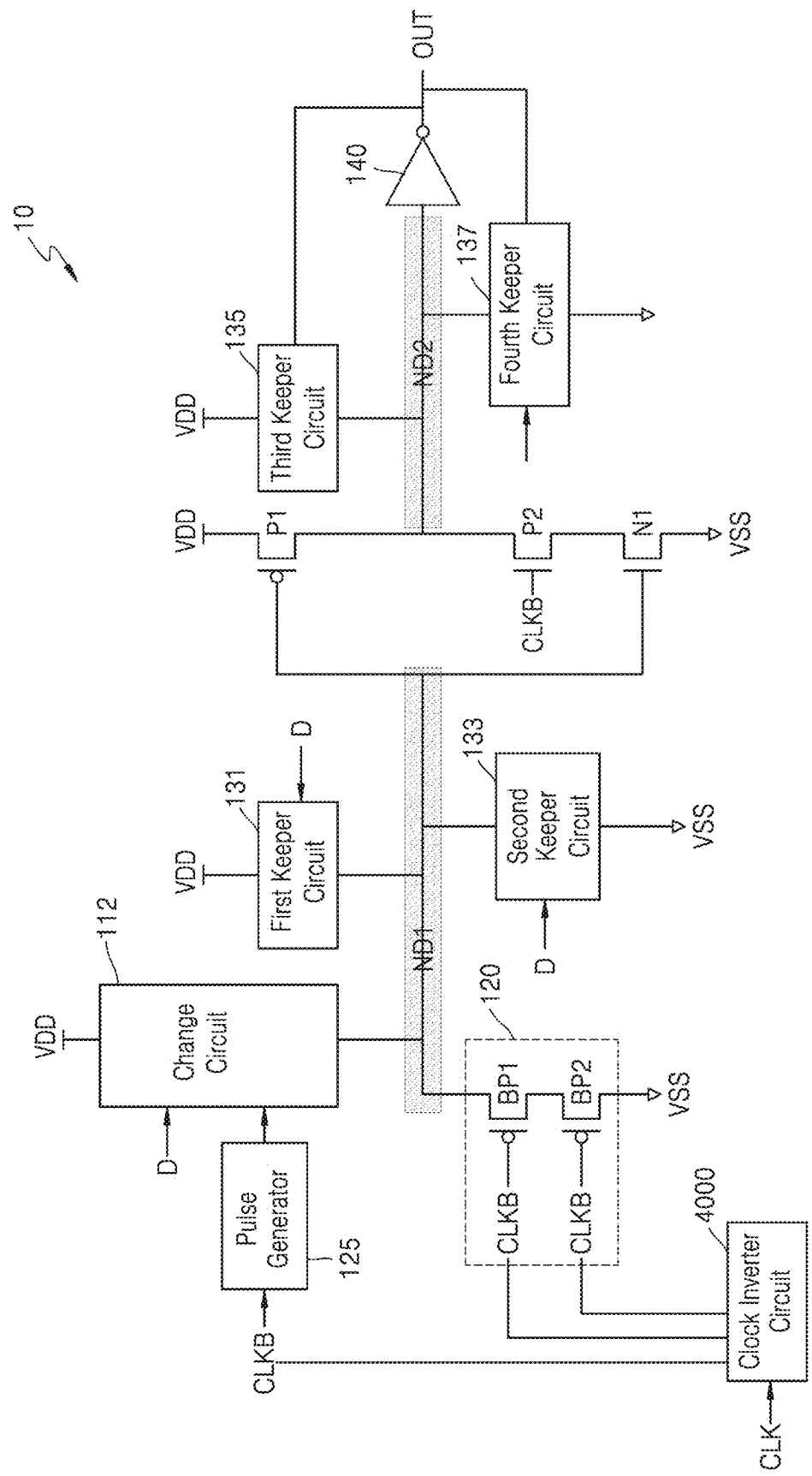
FIG. 9 illustrates a flip flop according to some example embodiments.

FIG. 9 illustrates a latch circuit of a flip flop according to some example embodiments.

Referring to FIG. 9, the data flip flop 10 may further include a clock inverter circuit 4000.

According to various example embodiments, the clock inverter circuit 4000 may generate an inverted clock signal CLKB based on the clock signal CLK and may output the inverted clock signal CLKB. For example, the clock inverter circuit 4000 may provide the inverted clock signal CLKB to each of a dynamic circuit and a static circuit of the data flip flop 10. To this end, the clock inverter circuit 4000 may be realized as a CMOS inverter configured to invert the clock signal CLK.

Referring to FIG. 9, the discharge circuit 120 may include at least two such as more than two NMOS transistors. The at least two NMOS transistors may be in series to form a serial stack structure and/or a NAND array. When the inverted clock signal CLKB is "logic low," the discharge circuit 120 may be turned on and may drop the voltage level of the first node ND1 through the ground line VSS.

A charge circuit 112 may receive the data input signal D and a pulse signal generated by the pulse generator 125 and may selectively charge the first node ND1 according to logic levels of the inverted clock signal CLKB and the data input signal D. The discharge circuit 120 may include logic gates according to a logic operation determined in advance.

Figure 10:
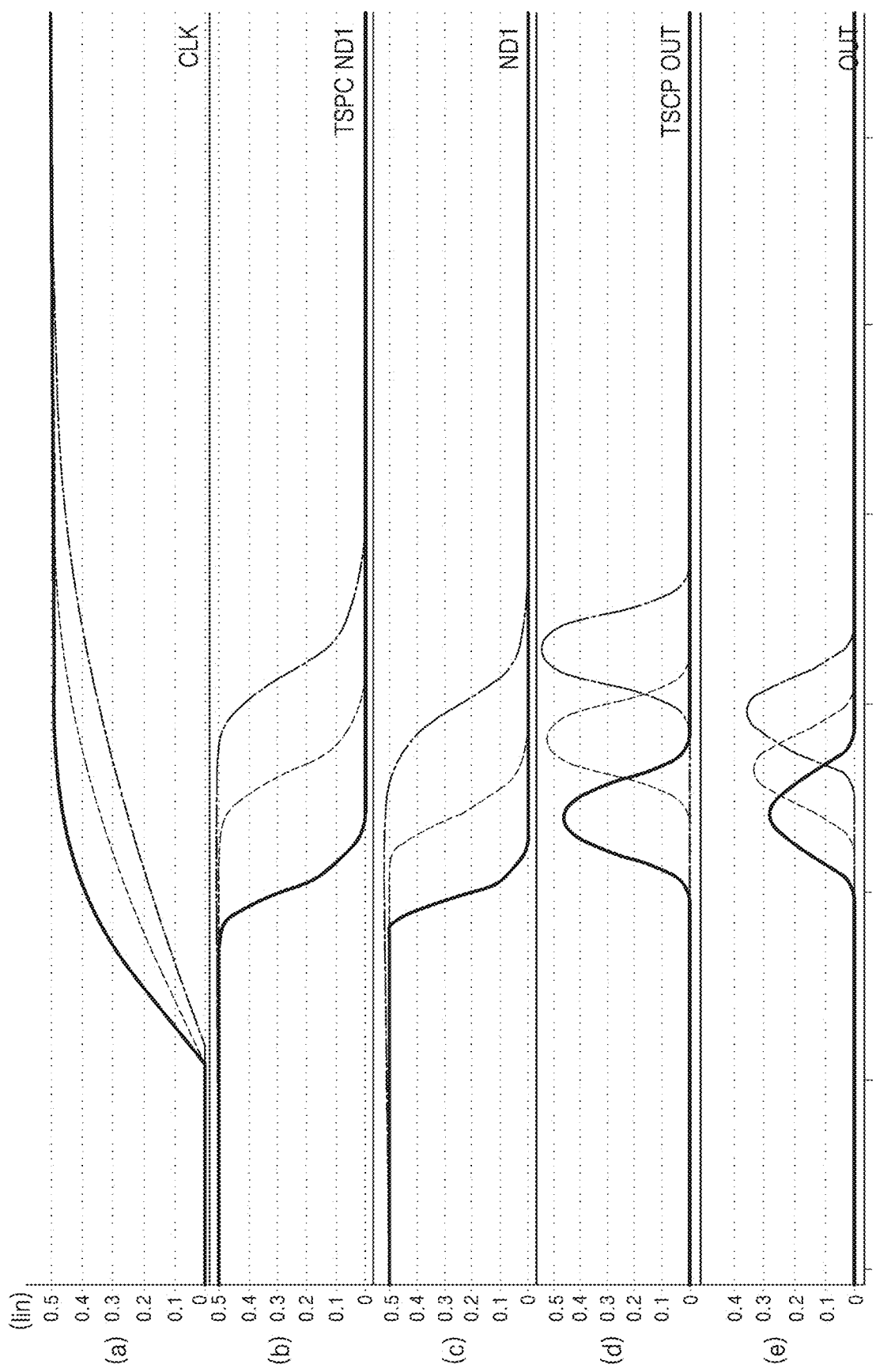
FIG. 10 is an experiment graph illustrating a change in glitch generation, according to some example embodiments.

FIG. 10 is an experiment graph illustrating a change in glitch generation, according to some example embodiments. FIG. 10 may correspond to a simulation such as a Simulation Program with Integrated Circuit Emphasis (SPICE) simulation; however, example embodiments are not limited thereto.

Referring to FIG. 10, shows the clock signal CLK transmitted to the data flip flop 10. The data flip flop 10 may operate according to clock signals having delayed transition times.

Graph (b) shows that the first node ND1 of the TSCP flip flop of FIG. 2 is discharged. Graph (c) shows that the first node ND1 of the flip flop of FIG. 4 is discharged. Referring to Graphs (b) and (c), a time taken to discharge the voltage level of the first node ND1 to 0 is shown to be decreased.

Graph (d) shows a glitch generation frequency of the TSCP flip flop of FIG. 2, and graph (e) shows a glitch generation frequency of the flip flop of FIG. 4. Referring to Graphs (d) and (e), as the first node ND1 is quickly discharged, it is found that the glitch generation frequency decreases. As the first node ND1 is quickly discharged, the number of times that glitches are generated may decrease to prevent the second node ND2 from being connected to the ground line VSS, or although the second node ND2 is connected to the ground line VSS, the glitches may decrease in size by reducing a time for electrical connection/bridging and the voltage drop degree of the second node ND2.

Figure 11A:
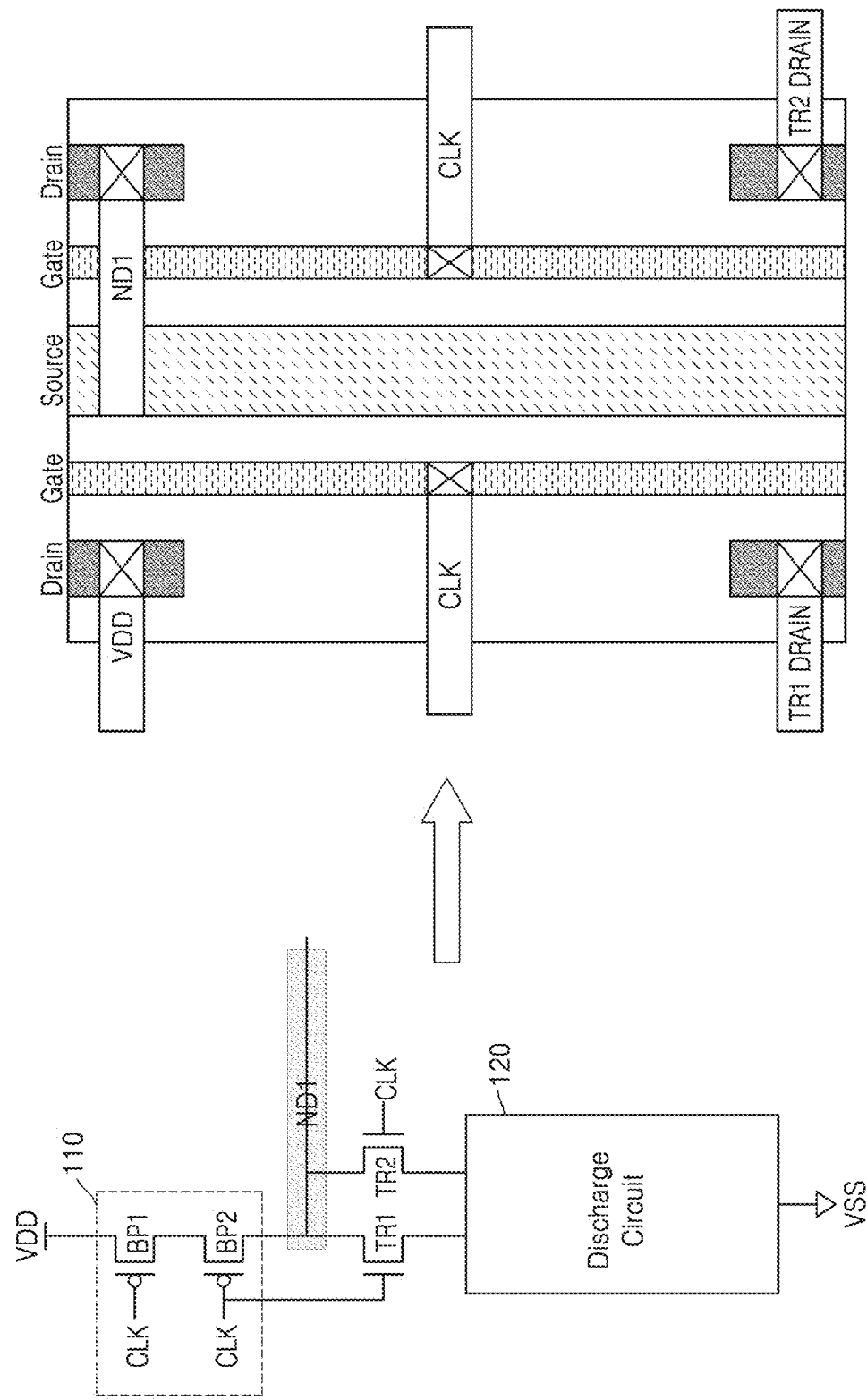
FIG. 11A illustrates a circuit diagram of a flip flop and a layout of the flip flop, according to some example embodiments.

FIG. 11A illustrates a circuit diagram of a flip flop and a layout of the flip flop, according to some example embodiments.

FIG. 11A illustrates at least part of a dynamic circuit of the data flip flop 10. The data flip flop 10 of FIG. 11A may include the precharge circuit 110, the discharge circuit 120, a first transistor TR1, and a second transistor TR2.

According to various example embodiments, the first transistor TR1 and the second transistor TR2 may be connected to the first node ND1. The precharge circuit 110 may be connected to the discharge circuit 120 through the first transistor TR1 and the second transistor TR2. The first transistor TR1 and the second transistor TR2 may be connected to each other in parallel. The first transistor TR1 and the second transistor TR2 may respectively correspond to NMOS transistors; however, example embodiments are not limited thereto. A gate terminal of the first transistor TR1 may receive the clock signal CLK. A gate terminal of the second transistor TR2 may receive the same clock signal CLK as that received by the first transistor TR1. Source terminals of the first transistor TR1 and the second transistor TR2 may be connected to the first node ND1. Drain terminals of the first transistor TR1 and the second transistor TR2 may be connected to the discharge circuit 120, respectively.

According to various example embodiments, the data flip flop 10 may be configured to have the same layout as a NOR gate receiving two inputs, because the data flip flop 10 further includes the first transistor TR1 and the second transistor TR2 connected in parallel between the discharge circuit 120 and the precharge circuit 110. Two inputs to the NOR gate may correspond to the clock signals CLK that are identical. Two clock signals CLK, which are input in parallel, may be wired above or below the discharge circuit 120 in the layout. For example, the data flip flop 10 may employ a layout of an existing NOR gate by adding the first transistor TR1 and the second transistor TR2 in parallel between the first node ND1 and the discharge circuit 120. When the first transistor TR1 and the second transistor TR2 are not included, a precharge circuit 110 having a series structure/serial stack structure needs to be or is desired to be realized according to a different layout, which may be more inefficient than using the layout of the existing NOR gate.

Figure 11B:
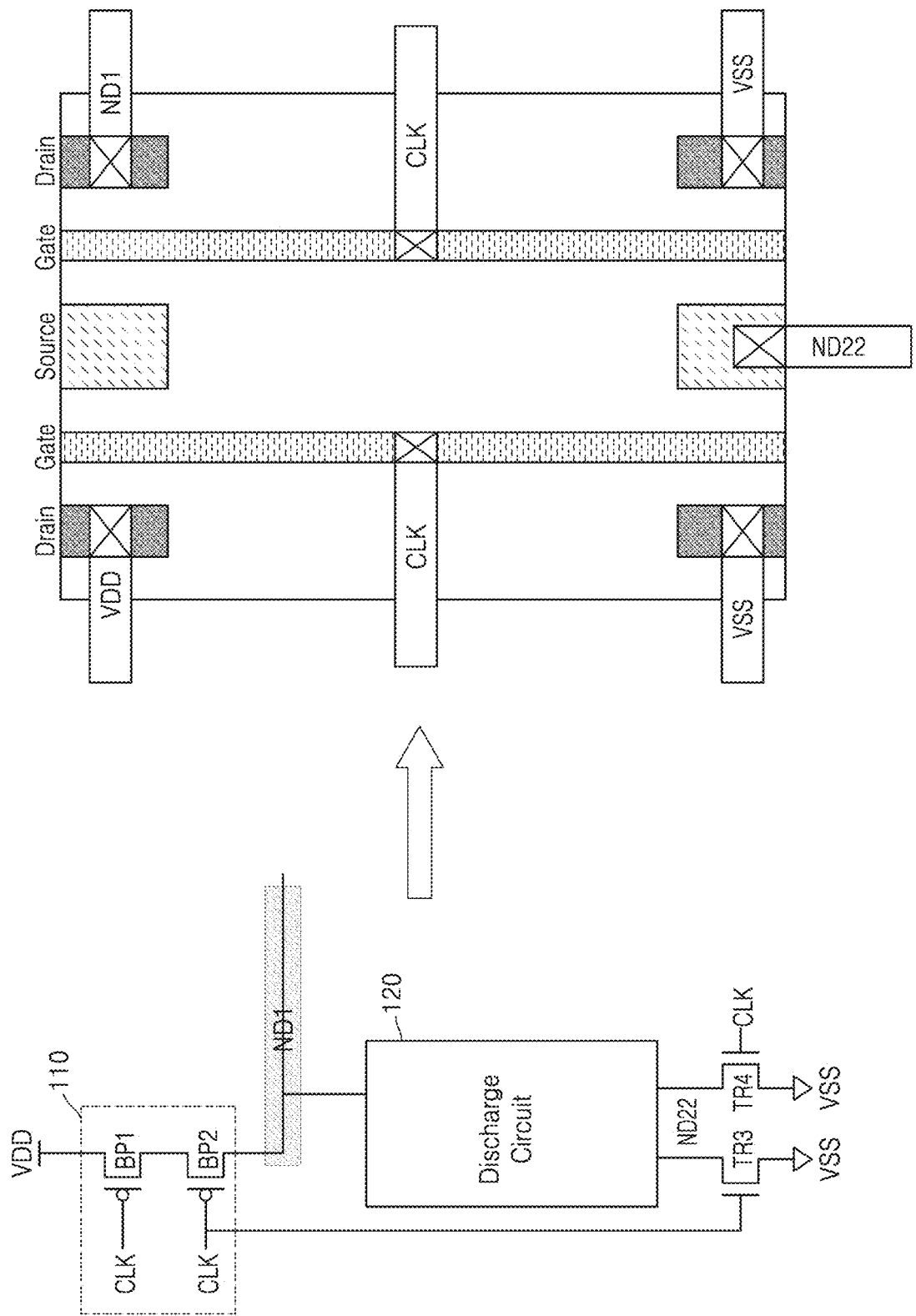
FIG. 11B illustrates a circuit diagram of a flip flop and a layout of the flip flop, according to some example embodiments.

FIG. 11B illustrates a circuit diagram of a flip flop and a layout of the flip flop, according to some example embodiments.

FIG. 11B illustrates at least part of a dynamic circuit of the data flip flop 10. The data flip flop 10 of FIG. 11B may include the precharge circuit 110, the discharge circuit 120, a third transistor TR3, and a fourth transistor TR4.

According to various example embodiments, the third transistor TR3 and the fourth transistor TR4 may be connected to the discharge circuit 120. The discharge circuit 120 may be connected to the ground line VSS through the third transistor TR3 and the fourth transistor TR4. The third transistor TR3 and the fourth transistor TR4 may be connected to each other in parallel. The third transistor TR3 and the fourth transistor TR4 may respectively correspond to NMOS transistors. The gate terminal of the third transistor TR3 may receive the clock signal CLK. The gate terminal of the fourth transistor TR4 may receive the same clock signal CLK as that received by the third transistor TR3. The drain terminals of the third transistor TR3 and the fourth transistor TR4 may be connected to the discharge circuit 120.

According to various example embodiments, the data flip flop 10 may be configured to have the same layout as a NOR gate receiving two inputs because the data flip flop 10 further includes the third transistor TR3 and the fourth transistor TR4 connected in parallel between the discharge circuit 120 and the ground line VSS. Two inputs to the NOR gate may correspond to the clock signals CLK that are identical. Two clock signals CLK, which are input in parallel, may be wired under or above the discharge circuit 120 in the layout. For example, the data flip flop 10 may employ a layout of an existing NOR gate by adding the third transistor TR3 and the fourth transistor TR4 in parallel between the ground line VSS and the discharge circuit 120. When the data flip flop 10 does not include the third transistor TR3 and the fourth transistor TR4, a precharge circuit 110 having a serial stack structure needs to be or is desired to be realized according to a different layout, which may be more inefficient than using the layout of the existing NOR gate.

While inventive concepts have been particularly shown and described with reference to some example embodiments thereof, it will be understood that various changes in form and details may be made therein without departing from the spirit and scope of the following claims. Example embodiments are not necessarily mutually exclusive with one another. For example, some example embodiments may include one or more features described with reference to one or more figures, and may also include one or more features described with reference to one or more other figures.

What is claimed is:

1. A flip flop comprising:
   a precharge circuit configured to charge a first node by bridging a power voltage node and the first node according to a voltage level of a clock signal, the pre-charge circuit including at least two PMOS transistors arranged directly in series, the at least two PMOS transistors configured to simultaneously receive a same clock signal;
   a discharge circuit configured to discharge the first node by bridging the first node and a ground node according to an input signal and the clock signal;
   a second node configured to be charged or discharged according to a voltage level of the first node; and
   an additional discharge circuit between the discharge circuit and the ground node includes at least two NMOS transistors arranged in parallel, the at least two NMOS transistors configured to simultaneously receive the same clock signal.

2. The flip flop of claim 1, wherein the precharge circuit comprises:
   a first PMOS transistor; and
   a second PMOS transistor, wherein
   the first PMOS transistor is connected in series between the power voltage node and the second PMOS transistor.

3. The flip flop of claim 2, wherein the precharge circuit is configured to simultaneously receive the clock signal at a gate of the first PMOS transistor and a gate of the second PMOS transistor.

4. The flip flop of claim 2, wherein,
   a speed at which the first node is discharged after the clock signal transits to logic high is based on a number of PMOS transistors in the precharge circuit.

5. The flip flop of claim 1, further comprising
   a first keeper circuit configured to maintain the voltage level of the first node,
   wherein the first keeper circuit comprises at least one of
   (A) at least one PMOS transistor configured to maintain the voltage level of the first node to logic high, according to at least the input signal, or
   (B) at least one NMOS transistor configured to maintain the voltage level of the first node to logic low, according to at least the input signal.

6. The flip flop of claim 1, further comprising:
   an inverter configured to reverse a voltage level of the second node; and
   a second keeper circuit configured to maintain the voltage level of the second node,
   wherein the second keeper circuit comprises,
   at least one PMOS transistor configured to maintain the voltage level of the second node to logic high according to an output signal from the inverter, or
   at least one NMOS transistor configured to maintain the voltage level of the second node to logic low according to the output signal from the inverter.

7. The flip flop of claim 1, wherein the at least two NMOS transistors comprise,
   a first NMOS transistor and a second NMOS transistor, the first NMOS transistor and the second NMOS transistor connected in parallel, wherein
   the additional discharge circuit is configured to simultaneously receive the clock signal at a gate of the first NMOS transistor and to a gate of the second NMOS transistor.

8. The flip flop of claim 1, further comprising:
   a third transistor and a fourth transistor, the third transistor and the fourth transistor connecting the discharge circuit to the ground node,
   wherein the third transistor and the fourth transistor are connected in parallel and receive the clock signal, respectively, and
   the precharge circuit, the third transistor, and the fourth transistor have a layout identical to a layout of a NOR gate configured to receive two inputs.

9. The flip flop of claim 1, wherein the at least two transistors are configured to turn on simultaneously in response to the same clock signal.

10. The flip flop of claim 1, wherein the flip flop is arranged as a D flip flop (DFF).

11. A dynamic flip flop comprising:
    a dynamic circuit configured to generate a static circuit input signal according to an input signal and to a phase transition of a clock signal; and
    a static circuit configured to generate an output signal synchronized with the clock signal, the output signal generated according to the static circuit input signal from the dynamic circuit,
    wherein the dynamic circuit comprises,
    a precharge circuit configured to charge a first node by bridging a power voltage and the first node through which the static circuit input signal is transmitted, and
    a discharge circuit configured to discharge the first node by bridging the first node and a ground node, and
    an additional discharge circuit between the discharge circuit and the ground node includes at least two NMOS transistors arranged in parallel, the at least two NMOS transistors configured to simultaneously receive the same clock signal,
    wherein the precharge circuit comprises a plurality of PMOS transistors connected directly in series, at least two of the plurality of PMOS transistors configured to receive a same clock signal.

12. The dynamic flip flop of claim 11, wherein
    the precharge circuit is configured to simultaneously transmit the clock signal to each of the plurality of PMOS transistors.

13. The dynamic flip flop of claim 12, wherein,
    a speed at which the clock signal transits to logic high and then discharges is based on a number of the plurality of PMOS transistors connected in series.

14. The dynamic flip flop of claim 11, wherein the dynamic circuit further comprises,
a first keeper circuit comprising at least one PMOS transistor configured to maintain a voltage level of the first node to logic high according to the input signal.

15. The dynamic flip flop of claim 14, wherein the dynamic circuit further comprises,
a second keeper circuit comprising at least one NMOS transistor configured to maintain the voltage level of the first node to logic low according to the input signal.

16. The dynamic flip flop of claim 11, wherein the static circuit further comprises:
an inverter configured to reverse an output voltage level of a second node that is charged or discharged according to the voltage level of the first node; and
a third keeper circuit comprising at least one PMOS transistor, the third keeper circuit configured to maintain the voltage level of the second node to logic high according to an output signal from the inverter.

17. The dynamic flip flop of claim 16, wherein the static circuit further comprises:
a fourth keeper circuit comprising at least one NMOS transistor, the fourth keeper circuit configured to maintain the voltage level of the second node to logic low according to the output signal from the inverter.

18. The dynamic flip flop of claim 11, wherein,
a speed at which the first node is discharged after the clock signal transits logic high is based on a number of NMOS transistors in the additional discharge circuit.

19. The dynamic flip flop of claim 12, wherein,
a speed at which the first node is precharged after the clock signal transits to logic low is based on a number of the plurality of PMOS transistors.

20. A flip flop comprising:
a precharge circuit configured to charge a first node by bridging a power voltage node and the first node according to a voltage level of a clock signal, the pre-charge circuit including at least two PMOS transistors arranged in series;
a discharge circuit configured to discharge the first node by bridging the first node and a ground node according to an input signal and the clock signal;
a second node configured to be charged or discharged according to a voltage level of the first node;
a first transistor and a second transistor, the first transistor and the second transistor connecting the first node to the discharge circuit,
wherein the first transistor and the second transistor are connected to each other in parallel and respectively receive the clock signal, and
the precharge circuit, the first transistor, and the second transistor have a layout identical to a layout of a NOR gate configured to receive two inputs.

21. The flip flop of claim 20, wherein the at least two transistors are configured to turn on simultaneously in response to the same clock signal.

22. The flip flop of claim 20, wherein the flip flop is arranged as a D flip flop (DFF).

* * * * *